(12) United States Patent
Grube et al.

(10) Patent No.: US 12,411,733 B2
(45) Date of Patent: Sep. 9, 2025

(54) GENERATING MULTIPLE SETS OF INTEGRITY INFORMATION IN A VAST STORAGE SYSTEM

(71) Applicant: Pure Storage, Inc., Santa Clara, CA (US)

(72) Inventors: Gary W. Grube, Barrington Hills, IL (US); Timothy W. Markison, Mesa, AZ (US); Sebastien Vas, Sunnyvale, CA (US); Zachary J. Mark, Chicago, IL (US); Jason K. Resch, Warwick, RI (US)

(73) Assignee: Pure Storage, Inc., Santa Clara, CA (US)

( * ) Notice: Subject to any disclaimer, the term of this patent is extended or adjusted under 35 U.S.C. 154(b) by 0 days.

(21) Appl. No.: 18/363,179

(22) Filed: Aug. 1, 2023

(65) Prior Publication Data
US 2023/0376380 A1 Nov. 23, 2023

Related U.S. Application Data

(60) Continuation of application No. 18/059,833, filed on Nov. 29, 2022, now Pat. No. 11,755,413, which is a
(Continued)

(51) Int. Cl.
*G06F 11/10* (2006.01)
*G06F 3/06* (2006.01)

(52) U.S. Cl.
CPC ........ *G06F 11/1076* (2013.01); *G06F 3/0619* (2013.01); *G06F 3/0653* (2013.01);
(Continued)

(58) Field of Classification Search
CPC ...... G06F 3/0619; G06F 3/065; G06F 3/0653; G06F 3/067; G06F 3/0689; G06F 11/1004; G06F 11/1076; H03M 13/09
See application file for complete search history.

(56) References Cited

U.S. PATENT DOCUMENTS 4,092,732 A 5/1978 Ouchi
4,961,139 A 10/1990 Hong
(Continued)

OTHER PUBLICATIONS

Chung; An Automatic Data Segmentation Method for 3D Measured Data Points; National Taiwan University; pp. 1-8; 1998.
(Continued)

*Primary Examiner* — Albert Decady
*Assistant Examiner* — Enamul M Kabir
(74) *Attorney, Agent, or Firm* — Katz Ruby & Carle LLP; Katherine C. Stuckman; Bruce E. Stuckman

(57) ABSTRACT

A method includes storing a plurality of data in a storage system. A plurality of identifiers corresponding to the plurality of data is determined and the plurality of identifiers are stored in the storage system. A first set of integrity information corresponding to a first system storage level is generated for the plurality of data by performing a first set of cyclic redundancy checks and the first set of integrity information is stored in the storage system. A second set of integrity information corresponding to a second system storage level is generated for the plurality of data and the second set of integrity information is stored in the storage system.

20 Claims, 8 Drawing Sheets

Related U.S. Application Data continuation of application No. 17/743,717, filed on May 13, 2022, now Pat. No. 11,544,146, which is a division of application No. 17/362,251, filed on Jun. 29, 2021, now Pat. No. 11,340,988, which is a continuation of application No. 17/023,971, filed on Sep. 17, 2020, now Pat. No. 11,080,138, which is a continuation-in-part of application No. 16/137,681, filed on Sep. 21, 2018, now Pat. No. 10,866,754, which is a continuation-in-part of application No. 14/454,013, filed on Aug. 7, 2014, now Pat. No. 10,154,034, which is a continuation-in-part of application No. 13/021,552, filed on Feb. 4, 2011, now Pat. No. 9,063,881, said application No. 17/362,251 is a continuation-in-part of application No. 16/390,530, filed on Apr. 22, 2019, now Pat. No. 11,194,662, which is a continuation of application No. 14/447,890, filed on Jul. 31, 2014, now Pat. No. 10,360,180, which is a continuation of application No. 13/154,725, filed on Jun. 7, 2011, now Pat. No. 10,289,688, said application No. 14/447,890 is a continuation-in-part of application No. 12/749,592, filed on Mar. 30, 2010, now Pat. No. 8,938,591, which is a continuation-in-part of application No. 12/218,594, filed on Jul. 16, 2008, now Pat. No. 7,962,641, which is a continuation-in-part of application No. 11/673,613, filed on Oct. 9, 2007, now Pat. No. 8,285,878, and a continuation-in-part of application No. 11/973,622, filed on Oct. 9, 2007, now Pat. No. 8,171,101, and a continuation-in-part of application No. 11/973,542, filed on Oct. 9, 2007, now Pat. No. 9,996,413, and a continuation-in-part of application No. 11/973,621, filed on Oct. 9, 2007, now Pat. No. 7,904,475, and a continuation-in-part of application No. 11/241,555, filed on Sep. 30, 2005, now Pat. No. 7,953,937, and a continuation-in-part of application No. 11/403,684, filed on Apr. 13, 2006, now Pat. No. 7,574,570, and a continuation-in-part of application No. 11/404,071, filed on Apr. 13, 2006, now Pat. No. 7,574,579, and a continuation-in-part of application No. 11/403,391, filed on Apr. 13, 2006, now Pat. No. 7,546,427, and a continuation-in-part of application No. 12/080,042, filed on Mar. 31, 2008, now Pat. No. 8,880,799, and a continuation-in-part of application No. 12/218,200, filed on Jul. 14, 2008, now Pat. No. 8,209,363.

(60) Provisional application No. 61/327,921, filed on Apr. 26, 2010, provisional application No. 61/357,430, filed on Jun. 22, 2010, provisional application No. 61/237,624, filed on Aug. 27, 2009.

(52) U.S. Cl.
CPC ............ *G06F 3/067* (2013.01); *G06F 3/0689* (2013.01); *G06F 11/1004* (2013.01)

(56) References Cited

U.S. PATENT DOCUMENTS

| | | | |
|---|---|---|---|
| 5,301,288 A * | | 4/1994 | Newman ............ G06F 12/0292 345/543 |
| 5,404,361 A | | 4/1995 | Casorso |
| 5,454,101 A | | 9/1995 | Mackay |
| 5,485,474 A | | 1/1996 | Rabin |
| 5,488,702 A | | 1/1996 | Byers |
| 5,632,012 A | | 5/1997 | Belsan |
| 5,664,144 A | | 9/1997 | Yanai |
| 5,768,623 A | | 6/1998 | Judd |
| 5,774,643 A | | 6/1998 | Lubbers |
| 5,802,364 A | | 9/1998 | Senator |
| 5,809,285 A | | 9/1998 | Hilland |
| 5,890,156 A | | 3/1999 | Rekieta |
| 5,909,692 A | | 6/1999 | Yanai |
| 5,987,622 A | | 11/1999 | Lo Verso |
| 5,991,414 A | | 11/1999 | Garay |
| 6,012,159 A | | 1/2000 | Fischer |
| 6,052,785 A | | 4/2000 | Lin |
| 6,058,454 A | | 5/2000 | Gerlach |
| 6,128,277 A | | 10/2000 | Bruck |
| 6,151,659 A | | 11/2000 | Solomon |
| 6,175,571 B1 | | 1/2001 | Haddock |
| 6,192,472 B1 | | 2/2001 | Garay |
| 6,256,688 B1 | | 7/2001 | Suetaka |
| 6,260,120 B1 | | 7/2001 | Blumenau |
| 6,272,658 B1 | | 8/2001 | Steele |
| 6,301,604 B1 | | 10/2001 | Nojima |
| 6,356,949 B1 | | 3/2002 | Katsandres |
| 6,366,982 B1 | | 4/2002 | Suzuki |
| 6,366,995 B1 | | 4/2002 | Nikolaevich |
| 6,374,336 B1 | | 4/2002 | Peters |
| 6,415,373 B1 | | 7/2002 | Peters |
| 6,418,539 B1 | | 7/2002 | Walker |
| 6,449,688 B1 | | 9/2002 | Peters |
| 6,567,948 B2 | | 5/2003 | Steele |
| 6,571,282 B1 | | 5/2003 | Bowman-Amuah |
| 6,606,629 B1 | | 8/2003 | Dekoning |
| 6,609,223 B1 | | 8/2003 | Wolfgang |
| 6,718,361 B1 | | 4/2004 | Basani |
| 6,760,808 B2 | | 7/2004 | Peters |
| 6,779,003 B1 | | 8/2004 | Midgley et al. |
| 6,785,768 B2 | | 8/2004 | Peters |
| 6,785,783 B2 | | 8/2004 | Buckland |
| 6,826,711 B2 | | 11/2004 | Moulton |
| 6,879,596 B1 | | 4/2005 | Dooply |
| 6,964,008 B1 | | 11/2005 | Van Meter, III |
| 7,003,688 B1 | | 2/2006 | Pittelkow |
| 7,024,451 B2 | | 4/2006 | Jorgenson |
| 7,024,609 B2 | | 4/2006 | Wolfgang |
| 7,028,139 B1 | | 4/2006 | Kiselev |
| 7,080,101 B1 | | 7/2006 | Watson |
| 7,103,824 B2 | | 9/2006 | Halford |
| 7,103,915 B2 | | 9/2006 | Redlich |
| 7,111,115 B2 | | 9/2006 | Peters |
| 7,140,044 B2 | | 11/2006 | Redlich |
| 7,146,644 B2 | | 12/2006 | Redlich |
| 7,149,935 B1 | | 12/2006 | Morris |
| 7,171,493 B2 | | 1/2007 | Shu |
| 7,222,133 B1 | | 5/2007 | Raipurkar |
| 7,240,236 B2 | | 7/2007 | Cutts |
| 7,246,369 B1 | | 7/2007 | Duan |
| 7,272,613 B2 | | 9/2007 | Sim |
| 7,299,325 B1 | | 11/2007 | Waterhouse |
| 7,461,319 B2 | | 12/2008 | Hanam |
| 7,574,570 B2 | | 8/2009 | Gladwin et al. |
| 7,636,724 B2 | | 12/2009 | De La Torre |
| 7,657,008 B2 | | 2/2010 | Zimba |
| 7,680,843 B1 | | 3/2010 | Panchbudhe |
| 7,904,475 B2 | | 3/2011 | Gladwin |
| 7,962,641 B1 | | 6/2011 | Dhuse |
| 8,082,390 B1 | | 12/2011 | Fan |
| 8,171,101 B2 | | 5/2012 | Gladwin |
| 8,209,363 B2 | | 6/2012 | Palthepu |
| 8,239,535 B2 * | | 8/2012 | Error ................ H04L 67/1008 709/224 |
| 8,266,237 B2 | | 9/2012 | Moore |
| 8,285,878 B2 | | 10/2012 | Gladwin |
| 8,451,908 B2 * | | 5/2013 | MacInnis ............. H04N 19/176 375/240.26 |
| 8,464,133 B2 | | 6/2013 | Grube |
| 8,626,820 B1 | | 1/2014 | Levy |
| 8,938,591 B2 | | 1/2015 | Mark |
| 9,229,646 B2 | | 1/2016 | Todd |
| 9,332,422 B2 | | 5/2016 | Bai |
| 9,401,838 B2 | | 7/2016 | Brady |
| 9,411,810 B2 | | 8/2016 | Mark |
| 2002/0062422 A1 | | 5/2002 | Butterworth |

(56) References Cited

U.S. PATENT DOCUMENTS

| | | |
|---|---|---|
| 2002/0129230 A1 | 9/2002 | Albright |
| 2002/0162075 A1* | 10/2002 | Talagala ................. G11B 20/18 |
| 2002/0162076 A1 | 10/2002 | Talagala |
| 2002/0165913 A1 | 11/2002 | Tokuda |
| 2002/0166079 A1 | 11/2002 | Ulrich |
| 2002/0170013 A1 | 11/2002 | Bolourchi |
| 2003/0018927 A1 | 1/2003 | Gadir |
| 2003/0037261 A1 | 2/2003 | Meffert |
| 2003/0046587 A1 | 3/2003 | Bheemarasetti |
| 2003/0065617 A1 | 4/2003 | Watkins |
| 2003/0084020 A1 | 5/2003 | Shu |
| 2003/0145270 A1 | 7/2003 | Holt |
| 2004/0024963 A1 | 2/2004 | Talagala |
| 2004/0122917 A1 | 6/2004 | Menon |
| 2004/0123202 A1 | 6/2004 | Talagala |
| 2004/0133577 A1 | 7/2004 | Miloushev |
| 2004/0133652 A1 | 7/2004 | Miloushev |
| 2004/0215998 A1 | 10/2004 | Buxton |
| 2004/0228493 A1 | 11/2004 | Ma |
| 2004/0243762 A1 | 12/2004 | Brant |
| 2005/0080330 A1 | 4/2005 | Masuzawa |
| 2005/0086646 A1 | 4/2005 | Zahavi |
| 2005/0100022 A1 | 5/2005 | Ramprashad |
| 2005/0114594 A1 | 5/2005 | Corbett |
| 2005/0125593 A1 | 6/2005 | Karpoff |
| 2005/0131993 A1 | 6/2005 | Fatula |
| 2005/0132070 A1 | 6/2005 | Redlich |
| 2005/0138235 A1 | 6/2005 | Khasid |
| 2005/0144382 A1 | 6/2005 | Schmisseur |
| 2005/0168460 A1 | 8/2005 | Razdan |
| 2005/0229069 A1 | 10/2005 | Hassner |
| 2006/0010416 A1 | 1/2006 | Kreck |
| 2006/0047907 A1 | 3/2006 | Shiga |
| 2006/0136448 A1 | 6/2006 | Cialini |
| 2006/0156059 A1 | 7/2006 | Kitamura |
| 2006/0224603 A1 | 10/2006 | Correll |
| 2006/0224852 A1 | 10/2006 | Kottomtharayil |
| 2006/0282744 A1 | 12/2006 | Kounavis |
| 2007/0033430 A1 | 2/2007 | Itkis |
| 2007/0079081 A1 | 4/2007 | Gladwin |
| 2007/0079082 A1 | 4/2007 | Gladwin |
| 2007/0079083 A1 | 4/2007 | Gladwin |
| 2007/0088970 A1 | 4/2007 | Buxton |
| 2007/0101074 A1* | 5/2007 | Patterson ............ G06F 16/1744 711/156 |
| 2007/0174192 A1 | 7/2007 | Gladwin |
| 2007/0180272 A1 | 8/2007 | Trezise |
| 2007/0180294 A1 | 8/2007 | Kameyama |
| 2007/0214285 A1 | 9/2007 | Au |
| 2007/0234110 A1 | 10/2007 | Soran |
| 2007/0245103 A1* | 10/2007 | Lam .................... G06F 11/1451 714/E11.123 |
| 2007/0283167 A1 | 12/2007 | Venters |
| 2008/0183975 A1 | 7/2008 | Foster |
| 2008/0282106 A1 | 11/2008 | Shalvi |
| 2008/0298470 A1 | 12/2008 | Boyce |
| 2009/0006487 A1 | 1/2009 | Gavrilov |
| 2009/0037500 A1 | 2/2009 | Kirshenbaum |
| 2009/0094250 A1 | 4/2009 | Dhuse |
| 2009/0094251 A1 | 4/2009 | Gladwin |
| 2009/0094318 A1 | 4/2009 | Gladwin |
| 2009/0150631 A1 | 6/2009 | Wilsey |
| 2009/0178144 A1 | 7/2009 | Redlich et al. |
| 2009/0183056 A1 | 7/2009 | Aston |
| 2009/0259667 A1 | 10/2009 | Wang |
| 2009/0265278 A1 | 10/2009 | Wang |
| 2009/0271454 A1 | 10/2009 | Anglin |
| 2009/0313248 A1 | 12/2009 | Balachandran |
| 2010/0023524 A1 | 1/2010 | Gladwin |
| 2010/0042523 A1 | 2/2010 | Henry |
| 2010/0042735 A1 | 2/2010 | Blinn |
| 2010/0074149 A1 | 3/2010 | Terada |
| 2010/0077447 A1 | 3/2010 | Dholakia |
| 2010/0138239 A1 | 6/2010 | Reicher |
| 2010/0162076 A1 | 6/2010 | Sim-Tang |
| 2010/0268692 A1 | 10/2010 | Resch |
| 2011/0029809 A1 | 2/2011 | Dhuse |
| 2011/0047192 A1 | 2/2011 | Utsunomiya |
| 2011/0107410 A1 | 5/2011 | Dargis |
| 2011/0126060 A1 | 5/2011 | Grube |
| 2011/0138391 A1 | 6/2011 | Cho |
| 2011/0238623 A1* | 9/2011 | Rodriguez ........... H04N 21/631 707/626 |
| 2011/0264989 A1 | 10/2011 | Resch et al. |
| 2011/0289122 A1 | 11/2011 | Grube |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

LEGG; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

* cited by examiner

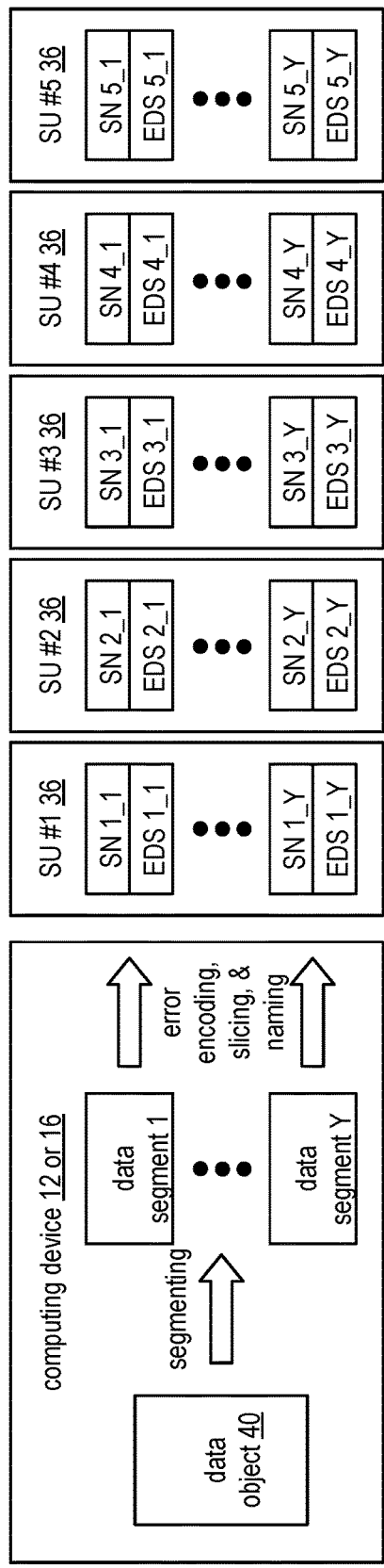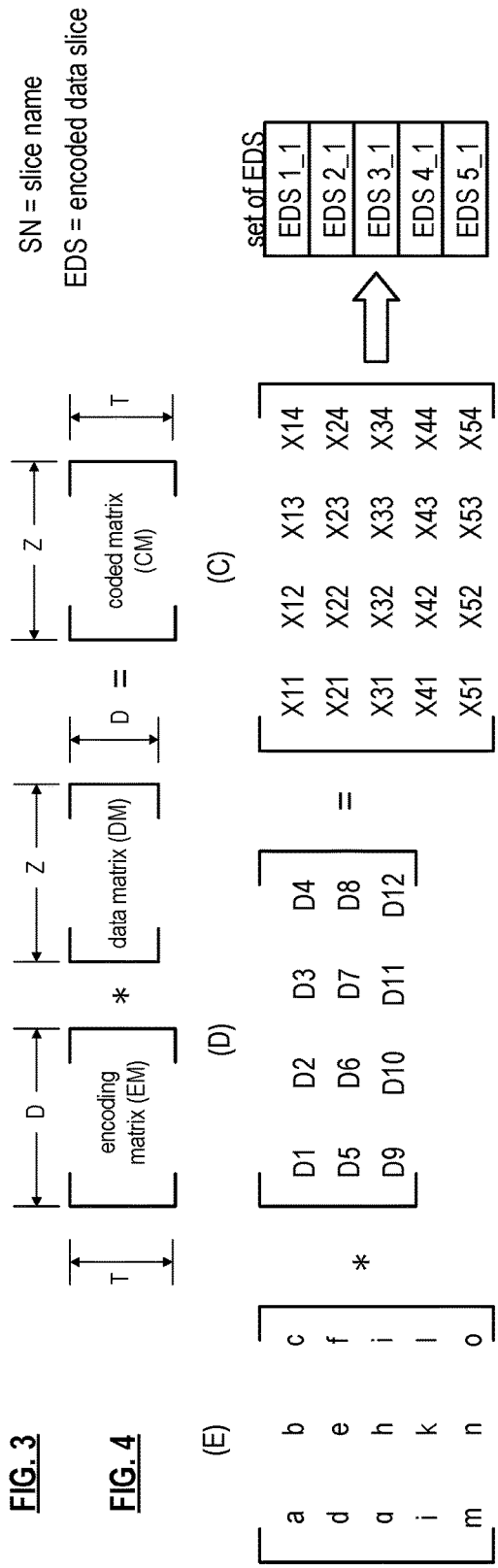

GENERATING MULTIPLE SETS OF INTEGRITY INFORMATION IN A VAST STORAGE SYSTEM

CROSS-REFERENCE TO RELATED APPLICATIONS

The present U.S. Utility patent application claims priority pursuant to 35 U.S.C. § 120 as a continuation of U.S. Utility application Ser. No. 18/059,833, entitled "UTILIZING INTEGRITY INFORMATION TO DETERMINE CORRUPTION IN A VAST STORAGE SYSTEM", filed Nov. 29, 2022, which is a continuation of U.S. Utility application Ser. No. 17/743,717, entitled "UTILIZING INTEGRITY INFORMATION IN A VAST STORAGE SYSTEM", filed May 13, 2022, issued as U.S. Pat. No. 11,544,146 on Jan. 3, 2023, which claims priority pursuant to 35 U.S.C. § 121 as a divisional of U.S. Utility application Ser. No. 17/362,251, entitled "GENERATING INTEGRITY INFORMATION IN A VAST STORAGE SYSTEM", filed Jun. 29, 2021, issued as U.S. Pat. No. 11,340,988 on May 24, 2022, which is a continuation of U.S. Utility application Ser. No. 17/023,971, entitled "STORING INTEGRITY INFORMATION IN A VAST STORAGE SYSTEM", filed Sep. 17, 2020, issued as U.S. Pat. No. 11,080,138 on Aug. 3, 2021, which is a continuation-in-part (CIP) of U.S. Utility application Ser. No. 16/137,681, entitled "CONTENT ARCHIVING IN A DISTRIBUTED STORAGE NETWORK", filed Sep. 21, 2018, issued as U.S. Pat. No. 10,866,754 on Dec. 15, 2020, which is a continuation-in-part (CIP) of U.S. Utility application Ser. No. 14/454,013, entitled "COOPERATIVE DATA ACCESS REQUEST AUTHORIZATION IN A DISPERSED STORAGE NETWORK", filed Aug. 7, 2014, issued as U.S. Pat. No. 10,154,034 on Dec. 11, 2018, which is a continuation-in-part (CIP) of U.S. Utility application Ser. No. 13/021,552, entitled "SLICE RETRIEVAL IN ACCORDANCE WITH AN ACCESS SEQUENCE IN A DISPERSED STORAGE NETWORK", filed Feb. 4, 2011, issued as U.S. Pat. No. 9,063,881 on Jun. 23, 2015, which claims priority pursuant to 35 U.S.C. § 119(e) to U.S. Provisional Application No. 61/327,921, entitled "SYSTEM ACCESS AND DATA INTEGRITY VERIFICATION IN A DISPERSED STORAGE SYSTEM", filed Apr. 26, 2010, all of which are hereby incorporated herein by reference in their entirety and made part of the present U.S. Utility patent application for all purposes.

U.S. Utility application Ser. No. 17/362,251 is also a continuation-in-part of U.S. Utility application Ser. No. 16/390,530, entitled "DIGEST LISTING DECOMPOSITION", filed Apr. 22, 2019, issued as U.S. Pat. No. 11,194,662 on Dec. 7, 2021, which is a continuation of U.S. Utility application Ser. No. 14/447,890, entitled "DIGEST LISTING DECOMPOSITION", filed Jul. 31, 2014, issued as U.S. Pat. No. 10,360,180 on Jul. 23, 2019, which is a continuation of U.S. Utility application Ser. No. 13/154,725, entitled, "METADATA ACCESS IN A DISPERSED STORAGE NETWORK", filed Jun. 7, 2011, issued as U.S. Pat. No. 10,289,688 on May 14, 2019, which claims priority pursuant to 35 U.S.C. § 119(e) to U.S. Provisional Application No. 61/357,430, entitled "DISPERSAL METHOD IN A DISPERSED STORAGE SYSTEM", filed Jun. 22, 2010, all of which are hereby incorporated herein by reference in their entirety and made part of the present U.S. Utility patent application for all purposes.

U.S. Utility application Ser. No. 14/447,890 also claims priority pursuant to 35 U.S.C. § 120 as a continuation-in-part of U.S. Utility application Ser. No. 12/749,592, entitled "DISPERSED STORAGE PROCESSING UNIT AND METHODS WITH DATA AGGREGATION FOR USE IN A DISPERSED STORAGE SYSTEM", filed Mar. 30, 2010, issued as U.S. Pat. No. 8,938,591 on Jan. 20, 2015, which claims priority pursuant to 35 U.S.C. § 119(e) to U.S. Provisional Application No. 61/237,624, entitled "DISPERSED STORAGE UNIT AND METHODS WITH METADATA SEPARATION FOR USE IN A DISPERSED STORAGE SYSTEM", filed Aug. 27, 2009, all of which are hereby incorporated herein by reference in their entirety and made part of the present U.S. Utility patent application for all purposes.

U.S. Utility application Ser. No. 12/749,592 also claims priority pursuant to 35 U.S.C. § 120 as a continuation-in-part of U.S. Utility application Ser. No. 12/218,594, entitled STREAMING MEDIA SOFTWARE INTERFACE TO A DISPERSED DATA STORAGE NETWORK, filed Jul. 16, 2008, issued as U.S. Pat. No. 7,962,641 on Jun. 14, 2011, which claims priority pursuant to 35 U.S.C. § 120 as a continuation-in-part of the following, all of which are hereby incorporated herein by reference in their entirety and made part of the present U.S. Utility patent application for all purposes:

1. U.S. Utility application Ser. No. 11/973,613, entitled BLOCK BASED ACCESS TO A DISPERSED DATA STORAGE NETWORK, filed Oct. 9, 2007, issued as U.S. Pat. No. 8,285,878 on Oct. 9, 2012;
2. U.S. Utility application Ser. No. 11/973,622, entitled SMART ACCESS TO A DISPERSED DATA STORAGE NETWORK, filed Oct. 9, 2007, issued as U.S. Pat. No. 8,171,101 on May 1, 2012;
3. U.S. Utility application Ser. No. 11/973,542, entitled ENSURING DATA INTEGRITY ON A DISPERSED STORAGE NETWORK, filed Oct. 9, 2007, issued as U.S. Pat. No. 9,996,413 on Jun. 12, 2018;
4. U.S. Utility application Ser. No. 11/973,621, entitled VIRTUALIZED STORAGE VAULTS ON A DISPERSED DATA STORAGE NETWORK, filed Oct. 9, 2007, issued as U.S. Pat. No. 7,904,475 on Mar. 8, 2011;
5. U.S. Utility application Ser. No. 11/241,555, entitled SYSTEM, METHODS, AND APPARATUS FOR SUBDIVIDING DATA FOR STORAGE IN A DISPERSED DATA STORAGE GRID, filed Sep. 30, 2005, which issued as U.S. Pat. No. 7,953,937 on May 31, 2011;
6. U.S. Utility application Ser. No. 11/403,684, entitled BILLING SYSTEM FOR INFORMATION DISPERSAL SYSTEM, filed Apr. 13, 2006, issued as U.S. Pat. No. 7,574,570 on Aug. 11, 2009;
7. U.S. Utility application Ser. No. 11/404,071, entitled METADATA MANAGEMENT SYSTEM FOR AN INFORMATION DISPERSED STORAGE SYSTEM, filed Apr. 13, 2006, issued as U.S. Pat. No. 7,574,579 on Aug. 11, 2009;
8. U.S. Utility application Ser. No. 11/403,391, entitled SYSTEM FOR REBUILDING DISPERSED DATA, filed Apr. 13, 2006, issued as U.S. Pat. No. 7,546,427 on Jun. 9, 2009;
9. U.S. Utility application Ser. No. 12/080,042, entitled REBUILDING DATA ON A DISPERSED STORAGE NETWORK, filed Mar. 31, 2008; issued as U.S. Pat. No. 8,880,799 on Nov. 4, 2014, and
10. U.S. Utility application Ser. No. 12/218,200, entitled FILE SYSTEM ADAPTED FOR USE WITH A DIS- PERSED DATA STORAGE NETWORK, filed Jul. 14, 2008, issued as U.S. Pat. No. 8,209,363 on Jun. 26, 2012.

In addition, U.S. Utility application Ser. No. 16/390,530, is related to the following U.S. patent applications that are commonly owned, all of which are hereby incorporated herein by reference in their entirety and made part of the present U.S. Utility patent application for all purposes:

1. DISPERSED STORAGE UNIT AND METHODS WITH METADATA SEPARATION FOR USE IN A DISPERSED STORAGE SYSTEM, Ser. No. 12/749,583, and filed on Mar. 30, 2010, issued as U.S. Pat. No. 9,235,350 on Jan. 12, 2016.
2. DISPERSED STORAGE PROCESSING UNIT AND METHODS WITH OPERATING SYSTEM DIVERSITY FOR USE IN A DISPERSED STORAGE SYSTEM, Ser. No. 12/749,606, and filed on Mar. 30, 2010, issued as U.S. Pat. No. 9,690,513 on Jun. 27, 2017.
3. DISPERSED STORAGE PROCESSING UNIT AND METHODS WITH GEOGRAPHICAL DIVERSITY FOR USE IN A DISPERSED STORAGE SYSTEM, Ser. No. 12/749,625, and filed on Mar. 3, 2011, issued as U.S. Pat. No. 9,772,791 on Sep. 26, 2017.

BACKGROUND

Technical Field

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Various conventional storage systems are used to archive user data. Usually, however, the data to be archived requires a user to specify a file path to the data to be stored in an archive, or by requiring a user to specify particular file or object name for storage.

BRIEF DESCRIPTION OF THE DRAWINGS

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION

Figure 1:
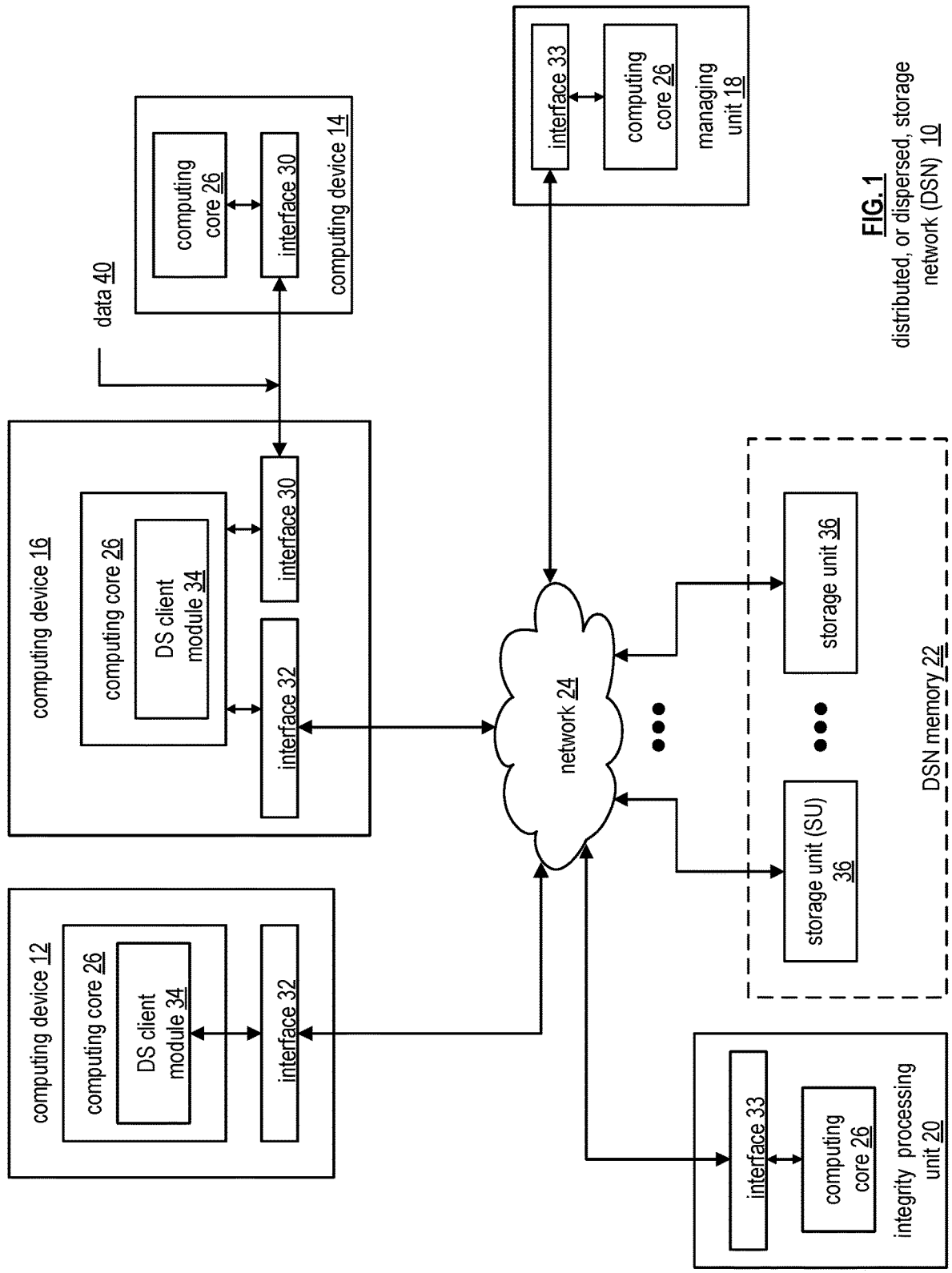
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
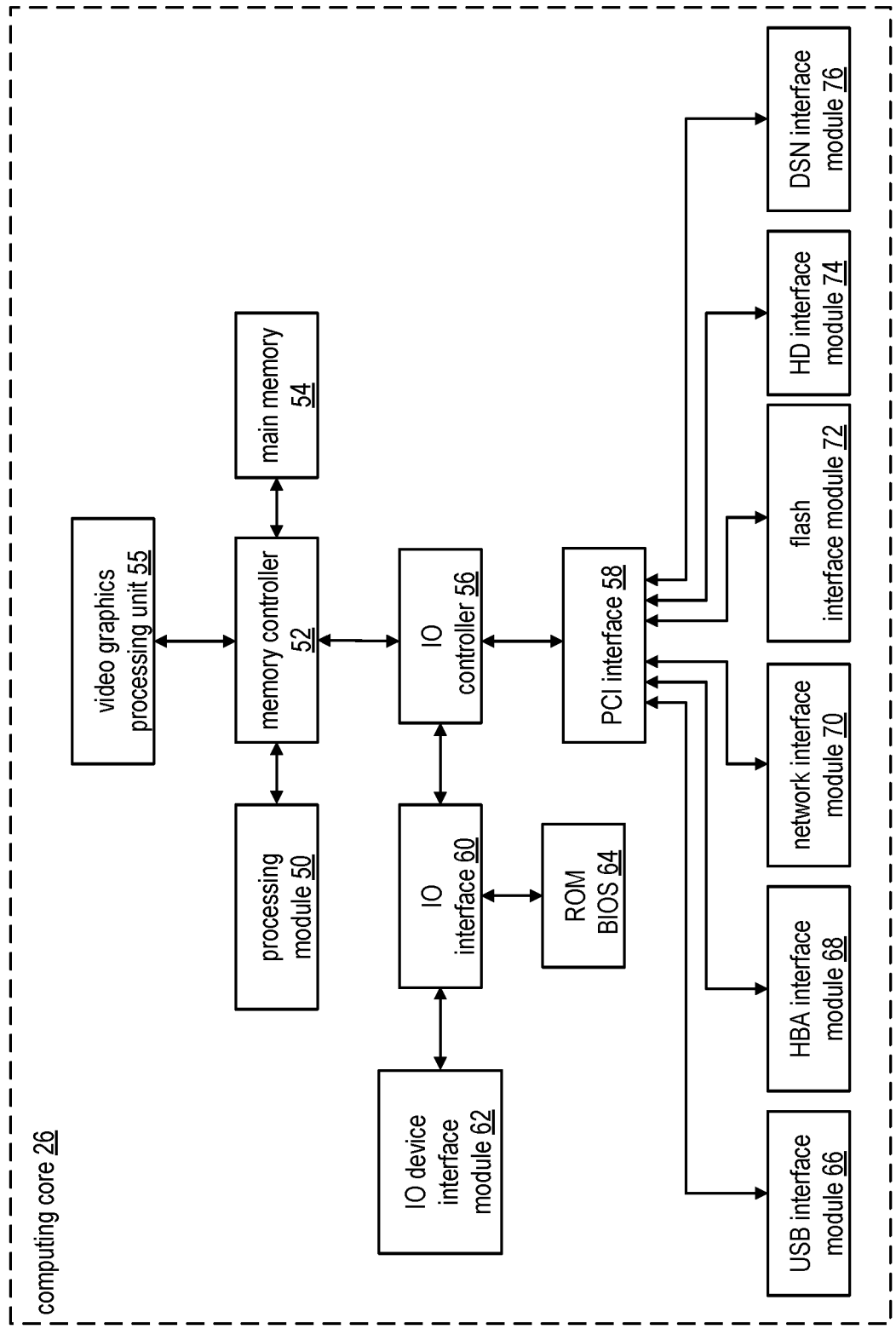
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
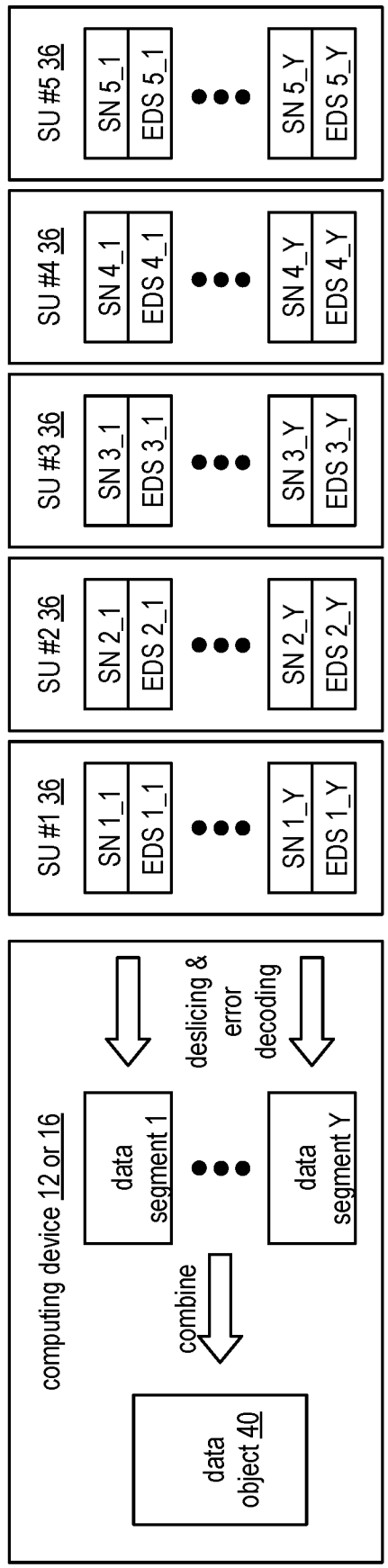
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
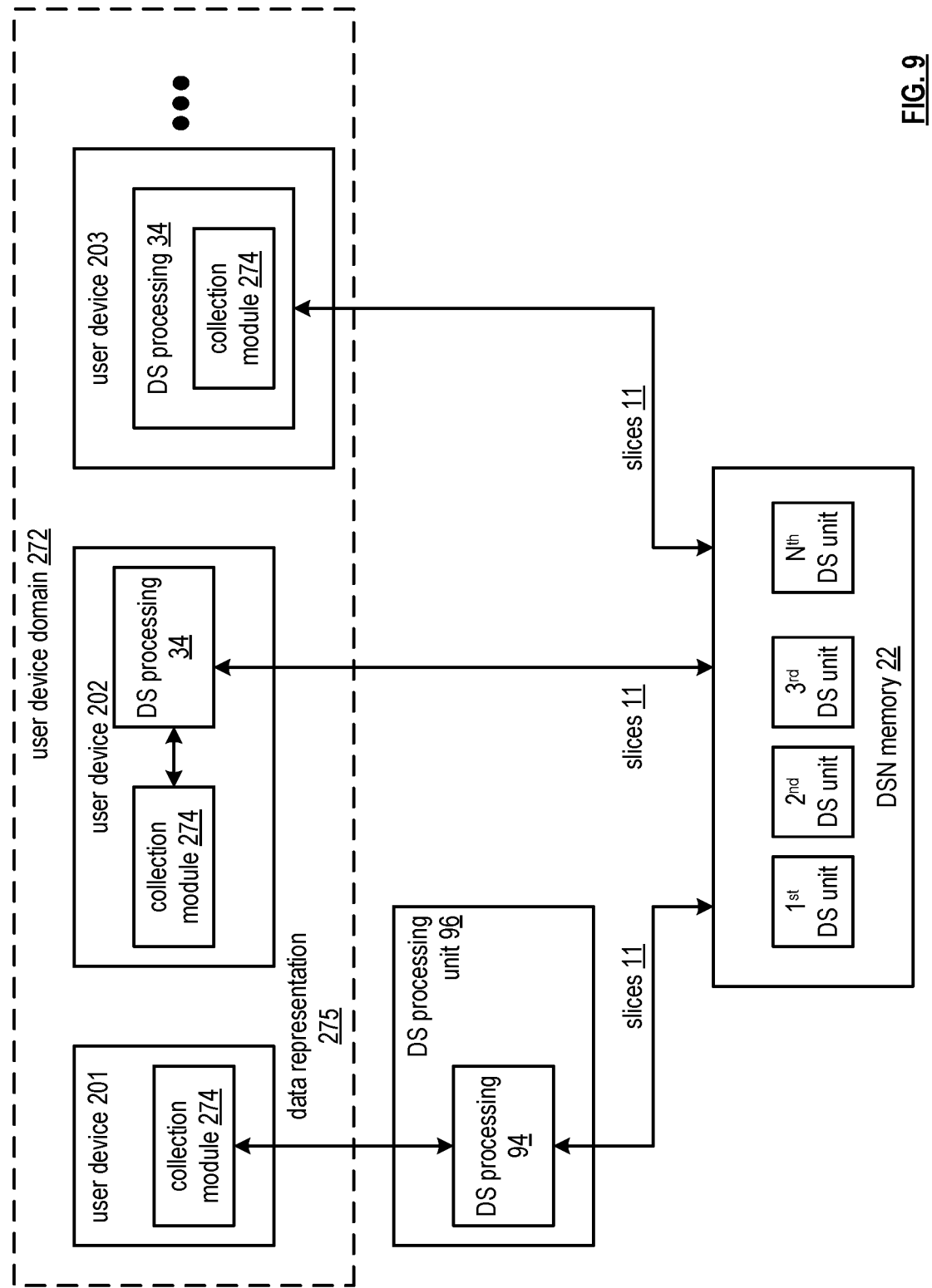
FIG. 9 is a schematic block diagram of another embodiment of a computing system in accordance with the present invention.
Figure 10:
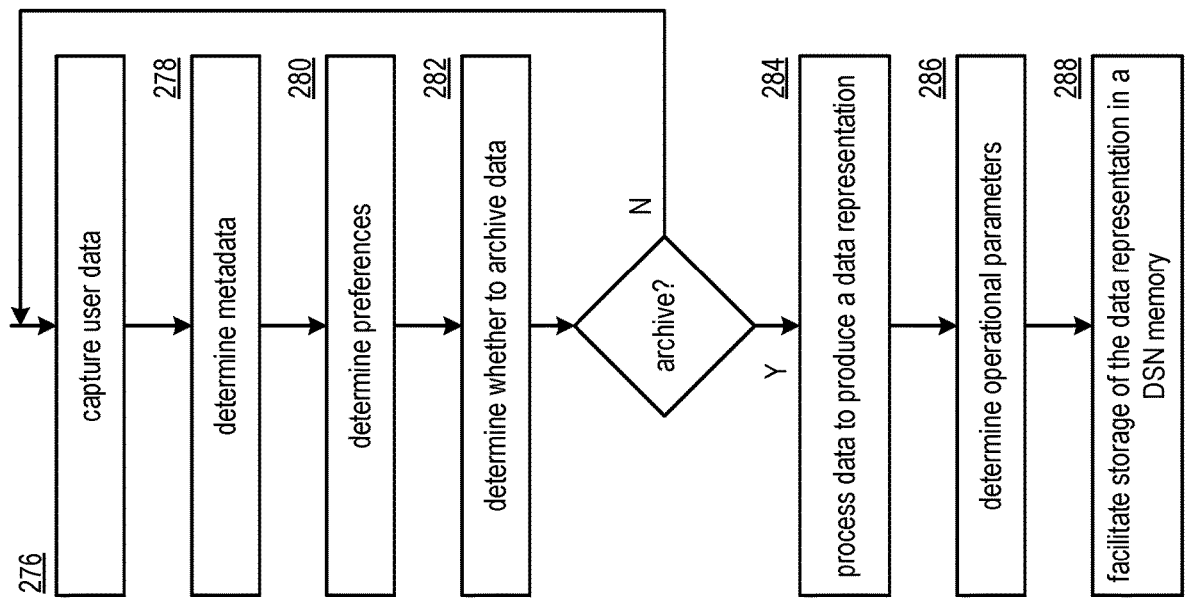
FIG. 10 is a flowchart illustrating an example of archiving data in accordance with the present invention.

FIGS. 9 and 10 illustrate particular embodiments in which content data stored in a user device, or data transmitted between a user device and an external device, can be automatically and conditionally archived using a distributed storage network (DSN). For example, a DS processing agent inside of a device (e.g., a smart phone, a land based phone, a laptop, desktop, the cable box, a home security system, a home automation system, etc.) grabs content, filters it, sorts it, and stores it in a DSN memory. For example: banking info, home video, pictures, e-mail, SMS, class notes, website visits, contacts, connections, grades, medical records, social networking messaging, and/or password lists. The DS processing agent correlates the data to preferences to determine how much content to save, and how often to store new content. The agent also determines operational parameters associated with the DSN based on one or more of the data type, age, priority, status, etc. In some implementations, the DS processing utilizes two different DS units to store different types of critical information, or to store particular types of critical information in pillars associated with two different DS units.

FIG. 9 is a schematic block diagram of another embodiment of a computing system that includes a user device domain 272, a dispersed storage (DS) processing unit 96, such as computing device 16, and a dispersed storage network (DSN) memory 22. The user device domain 272 includes user devices 201-203. Note that the user device domain 272 may include any number of user devices. The DS processing unit 96 includes a DS processing module 94 and the DSN memory 22 includes a plurality of $1^{st}$-$N^{th}$ DS units. Such user devices 201-203 of the user device domain 272 are associated with a common user such that data, information, and/or messages traversed by the user devices 201-203 share relationship with the common user. The DS processing unit 96 provides user device 201 access to the DSN memory 22 when the user device 201 does not include a DS processing module 94, such as DS client module 34.

The user devices 201-203 may include fixed or portable devices as discussed previously (e.g., a smart phone, a wired phone, a laptop computer, a tablet computer, a desktop computer, a cable set-top box, a smart appliance, a home security system, a home automation system, etc.). The user devices 201-203 may include a computing core, one or more interfaces, the DS processing module 94 and/or a collection module 274. For example, user device 201 includes the collection module 274. User device 202 includes the collection module 274 and the DS processing module 94. User device 3 includes the DS processing module 94 which includes the collection module 274. The collection module 274 includes a functional entity (e.g., a software application that runs on a computing core or as part of a processing module) that intercepts user data, processes the user data to produce a data representation, and/or facilitates storage of the data representation in the DSN memory in accordance with one or more of metadata, preferences, and/or operational parameters (e.g., dispersed storage error coding parameters).

In an example of operation, the user devices 201-203 traverse the user data from time to time where the user data may include one or more of banking information, home video, video broadcasts, pictures from a user camera, e-mail messages, short message service messages, class notes, website visits, web downloads, contact lists, social networking connections, school grades, medical records, social networking messaging, password lists, and any other user data type associated with the user. Note that the user data may be communicated from one user device to another user device and/or from a user device to a module or unit external to the computing system. Further note that the user data may be stored in any one or more of the user devices 201-203.

In another example of operation, the collection module 274 of user device 201 intercepts medical records that are being processed by user device 201. The collection module 274 determines metadata based on the medical records and determines preferences based on a user identifier (ID). The collection module 274 determines whether to archive the medical records based in part on the medical records, the metadata, and the preferences. The collection module 274 processes the medical records in accordance with the preferences to produce a data representation when the collection module 274 determines to archive the medical records. For example, the collection module 274 of the user device 201 sends the data representation 275 to the DS processing unit 96. The data representation 275 may include one or more of the data, the metadata, the preferences, and storage guidance. The DS processing unit 96 determines operational parameters, creates encoded data slices based on the data representation, and sends the encoded data slices 11 to the DSN memory 22 with a store command to store the encoded data slices 11. As another example, the collection module 274 of the user device 201 determines operational parameters based in part on one or more of the user data, the metadata, the preferences, and the data representation. Next, the collection module 274 sends the data representation 275 to the DS processing unit 96. In this example, the data representation 275 may include one or more of the operational parameters, the metadata, the preferences, and storage guidance. The DS processing unit 96 determines final operational parameters based in part on the operational parameters from the collection module 274, creates encoded data slices based on the data representation and the final operational parameters, and sends the encoded data slices 11 to the DSN memory 22 with a store command to store the encoded data slices 11.

In yet another example of operation, the collection module 274 of user device 202 intercepts banking records that are being viewed by user device 202. The collection module 274 determines metadata based on the banking records and determines preferences based on a user ID. The collection module 274 determines whether to archive the banking records based on the banking records, the metadata, and the preferences. The collection module 274 processes the banking records in accordance with the preferences to produce a data representation when the collection module determines to archive the banking records. For example, the collection module 274 sends the data representation to the DS processing module 94 of the $2^{nd}$ DS such that the data representation may include one or more of the metadata, the preferences, and storage guidance. The DS processing module 94 determines operational parameters, creates encoded data slices based on the data representation, and sends the encoded data slices 11 to the DSN memory 22 with a store command to store the encoded data slices 11. As another example, the collection module 274 determines operational parameters based on one or more of the user data (e.g., the banking records), the metadata, the preferences, and the data representation. The collection module 274 sends the data representation to the DS processing module 94 of the $2^{nd}$ DS unit, wherein the data representation includes one or more of the operational parameters, the metadata, the preferences, and storage guidance. The DS processing module 94 determines final operational parameters based in part on the operational parameters from the collection module, creates encoded data slices based on the data representation and the final operational parameters, and sends the encoded data slices 11 to the DSN memory 22 with a store command to store the encoded data slices 11.

In a further example of operation, the collection module 274 of user device 203 intercepts home video files that are being processed by user device 203. The collection module 274 determines metadata based on one or more of the home video files and determines preferences based in part on a user ID. The collection module 274 determines whether to archive the home video files based on the home video files, the metadata, and the preferences. The collection module 274 processes the home video files in accordance with the preferences to produce a data representation when the collection module 274 determines to archive the home video files. For example, the collection module 274 sends the data representation to the DS processing module 94 of the $3^{rd}$ DS unit, wherein the data representation includes one or more of the metadata, the preferences, and storage guidance. The DS processing module 94 determines operational parameters, creates encoded data slices based on the data representation and the operational parameters, and sends the encoded data slices 11 to the DSN memory 22 with a store command to store the encoded data slices 11. As another example, the collection module 274 determines operational parameters based on one or more of the user data (e.g., the home video files), the metadata, the preferences, and the data representation. The collection module 274 sends the data representation to the DS processing module 94 of the $3^{rd}$ DS unit, wherein the data representation includes one or more of the operational parameters, the metadata, the preferences, and storage guidance. The DS processing module 94 determines final operational parameters based on the operational parameters from the collection module 274, creates encoded data slices based on the data representation and the final operational parameters, and sends the encoded data slices 11 to the DSN memory 22 with a store command to store the encoded data slices 11.

FIG. 10 is a flowchart illustrating an example of archiving data. The method begins with step 276 where the processing module captures user data. Such capturing may include one or more of monitoring a data stream between a user device and an external entity, monitoring a data stream internally between functional elements within the user device, and retrieving stored data from a memory of the user device. The method continues at step 278 where the processing module determines metadata, wherein the metadata may include one or more of a user identifier (ID), a data type, a source indicator, a destination indicator, a context indicator, a priority indicator, a status indicator, a time indicator, and a date indicator. Such a determination may be based on one or more of the captured user data, current activity or activities of the user device (e.g., active processes, machines state, input/output utilization, memory utilization, etc.), geographic location information, clock information, a sensor input, a user record, a lookup, a command, a predetermination, and message. For example, the processing module determines the metadata to include a banking record data type indicator and a geographic location-based context indicator when the processing module determines the banking data type and geographic location information.

The method continues with step 280 where the processing module determines preferences, wherein the preferences may include one or more of archiving priority by data type, archiving frequency, context priority, status priority, volume priority, performance requirements, and reliability requirements. Such a determination may be based on one or more of the user ID, the user data, the metadata, context information, a lookup, a predetermination, a command, a query response, and a message. The method continues at step 282 where the processing module determines whether to archive data based on one or more of the metadata, context information, a user ID, a lookup, the preferences, and a comparison of the metadata to one or more thresholds. For example, the processing module determines to archive data when the metadata indicates that the user data comprises new banking records. As another example, the processing module determines to not archive data when the metadata indicates that the user data comprises routine website access information. The method repeats back to step 276 when the processing module determines not to archive data. The method continues to step 284 when the processing module determines to archive data.

The method continues at step 284 where the processing module processes the user data to produce a data representation, wherein the data representation may be in a compressed and/or a transformed form to facilitate storage in a dispersed storage network (DSN) memory. The processing module processes the data based on one or more of the captured data, the metadata, the preferences, a processing method table lookup, a command, a message, and a predetermination. For example, the processing module processes the user data to produce a data representation where a size of the data representation facilitates an optimization of DSN memory storage efficiency. For instance, the data representation size may be determined to align with a data segment and data slice sizes such that memory is not unnecessarily underutilized as data blocks are stored in dispersed storage (DS) units of the DSN memory.

The method continues at step 286 where the processing module determines operational parameters. Such a determination may be based on one or more of the data representation, the captured user data, the metadata, the preferences, a processing method table lookup, a command, a message, and a predetermination. For example, the processing module determines a pillar width and decode threshold such that an above average reliability approach to storing the data representation is provided when the processing module determines that the metadata indicates that the user data comprises very high priority financial records requiring a very long term of storage without failure.

The method continues at step 288 where the processing module facilitates storage of the data representation in the DSN memory. For example, the processing module dispersed storage error encodes the data representation utilizing the operational parameters to produce encoded data slices. Next, the processing module sends the encoded data slices to the DS units of the DSN memory for storage therein.

Figure 11:
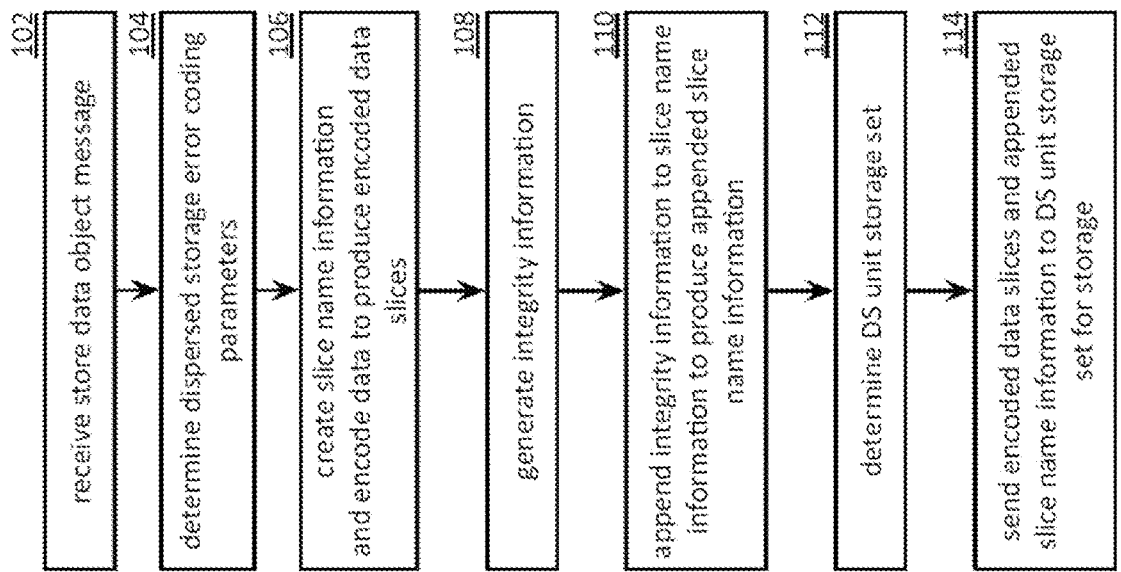
FIG. 11 is a flowchart illustrating an example of generating integrity information in accordance with the invention.

FIG. 11 is a flowchart illustrating an example of generating integrity information. The method begins at step 102 where a processing module receives a store data object message. Such a store data object message may include one or more of data, a user identifier (ID), a request, a data ID, a data object name, a data object, a data type indicator, a data object hash, a vault ID, a data size indicator, a priority indicator, a security indicator, and a performance indicator. The method continues at step 104 where the processing module determines dispersed storage error coding parameters (e.g., operational parameters) including one or more of a pillar width, a write threshold, a read threshold, an encoding method, a decoding method, an encryption method, a decryption method, a key, a secret key, a public key, a private key, a key reference, and an integrity information generation method designator. Such a determination may be based on one or more of information received in the store data object message, the user ID, the data ID, a vault lookup, a list, a command, a message, and a predetermination.

The method continues at step 106 where the processing module dispersed storage error encodes data to produce a plurality of sets of encoded data slices in accordance with the dispersed storage error coding parameters. In addition, the processing module determines a plurality of sets of slice names corresponding to the plurality of sets of encoded data slices; where a slice name includes one or more of a slice index, a vault ID, a generation, an object number, and a segment number. Within a slice name, the slice index indicates a pillar number of a pillar width associated with the dispersed storage error coding parameters, the vault ID indicates a storage resource of a storage system common to one or more user devices, the generation indicates portions of a corresponding vault, the object number is associated with the data ID (e.g., a hash of the data ID), and the segment number indicates a segment identifier associated with one of a plurality of data segments (e.g., the plurality of data segment constitutes the data, a data file, etc.).

The method continues at step 108 where the processing module determines integrity information for the plurality of sets of slice names. Such a determination may be in accordance with one or more integrity methods. In a first integrity method, the processing module generates individual integrity information for at least some of the slice names of at least some of the plurality of sets of slice names (e.g., at a slice name level) and generates the integrity information based on the individual integrity information. The individual integrity information may be generated by performing one or more of a hash function, cyclic redundancy check, encryption function, an encrypted digital signature function (e.g., digital signature algorithm (DSA), El Gamal, Elliptic Curve DSA, Rivest, Shamir and Adleman (RSA)), and parity check on a slice name of the at least some of the slices names of at least some of the plurality of sets of slices names to generate the individual integrity information. The hash function may include a hashed message authentication code (e.g., secure hash algorithm 1 (SHA1), hashed message authentication code message digest algorithm 5 (HMAC-MD5)) that uses a shared key and the encryption function includes an encryption algorithm that utilizes a private key, which is paired to a public key. In an example of generating individual integrity information, the processing module calculates a hash of at least some of the slice names and then encrypts the hash in accordance with an encryption method to produce an encrypted digital signature.

In a second integrity method, the processing module generates set integrity information for a set of slice names of at least some of the plurality of sets of slice names (e.g., at a set level) and generates the integrity information based on the set integrity information. The set integrity information may be generated by performing one or more of the hash function, the cyclic redundancy check, the encryption function, the encrypted digital signature function, and the parity check on the set of slice names of at least some of the plurality of sets of slice names to generate the set integrity information.

In a third integrity method, the processing module generates pillar integrity information for a pillar set of slice names of at least some of the plurality of sets of slice names (e.g., at a pillar level) and generates the integrity information based on the pillar integrity information. The pillar integrity information may be generated by performing one or more of the hash function, the cyclic redundancy check, the encryption function, the encrypted digital signature function, and the parity check on the pillar set of slice names of at least some of the plurality of sets of slice names to generate the pillar integrity information.

In a fourth integrity method, the processing module generates data file integrity information for at least some of the plurality of sets of slice names (e.g., at the data file level) and generates the integrity information based on the data file integrity information. The data file integrity information may be generated by performing one or more of the hash function, the cyclic redundancy check, the encryption function, the encrypted digital signature function, and the parity check on the at least some of the plurality of sets of slice names to generate the data file integrity information.

In a fifth integrity method, the processing module generates combined integrity information for at least some of the encoded data slices of the plurality of sets of encoded data slices and for at least some of the slices names of at least some of the plurality of sets of slice names and generates the integrity information based on the combined integrity information. The combined integrity information includes performing one or more of the hash function, the cyclic redundancy check, the encryption function, the encrypted digital signature function, and the parity check on two or more of an encoded data slice of the at least some of the encoded data slices of the plurality of encoded data slices, a revision identifier, and an associated slice name of the at least some of the slice names of the plurality of sets of slice names to generate the combined integrity information. For example, the processing module performs an RSA encrypted digital signature on a combination of an encoded data slice and an associated slice name to generate the combined integrity information. As another example, the processing module performs a HMAC function on a set of combinations of encoded data slices and associated slice names name to generate the combined integrity information. As yet another example, the processing module performs a DSA encrypted digital signature on a combination of an encoded data slice, an associated slice name, and an associated revision identifier to generate the combined integrity information.

The integrity information may be generated as a combination of the various methods. For example, the processing module performs the first integrity method, the fourth integrity method, and at least one of the second and third integrity methods to generate the integrity information.

The method continues at step 110 where the processing module appends the integrity information to the slice name information to produce appended slice name information. For example, the processing module appends a HMAC digest to the slice name, revision, and date of a single encoded data slice. The method continues at step 112 where the processing module determines a dispersed storage (DS) unit storage set. Such a determination may be based on one or more of information received in the store data object message, a vault lookup, a list, a command, a message, a predetermination, the dispersed storage error coding parameters, encoded data slices, a dispersed storage network (DSN) memory status indicator, the slice name information, a virtual DSN address to physical location table lookup, and the integrity information. The method continues at step 114 where the processing module sends the plurality of sets of encoded data slices, the plurality of sets of slice names, and the integrity information to a DSN memory for storage therein.

Figure 12:
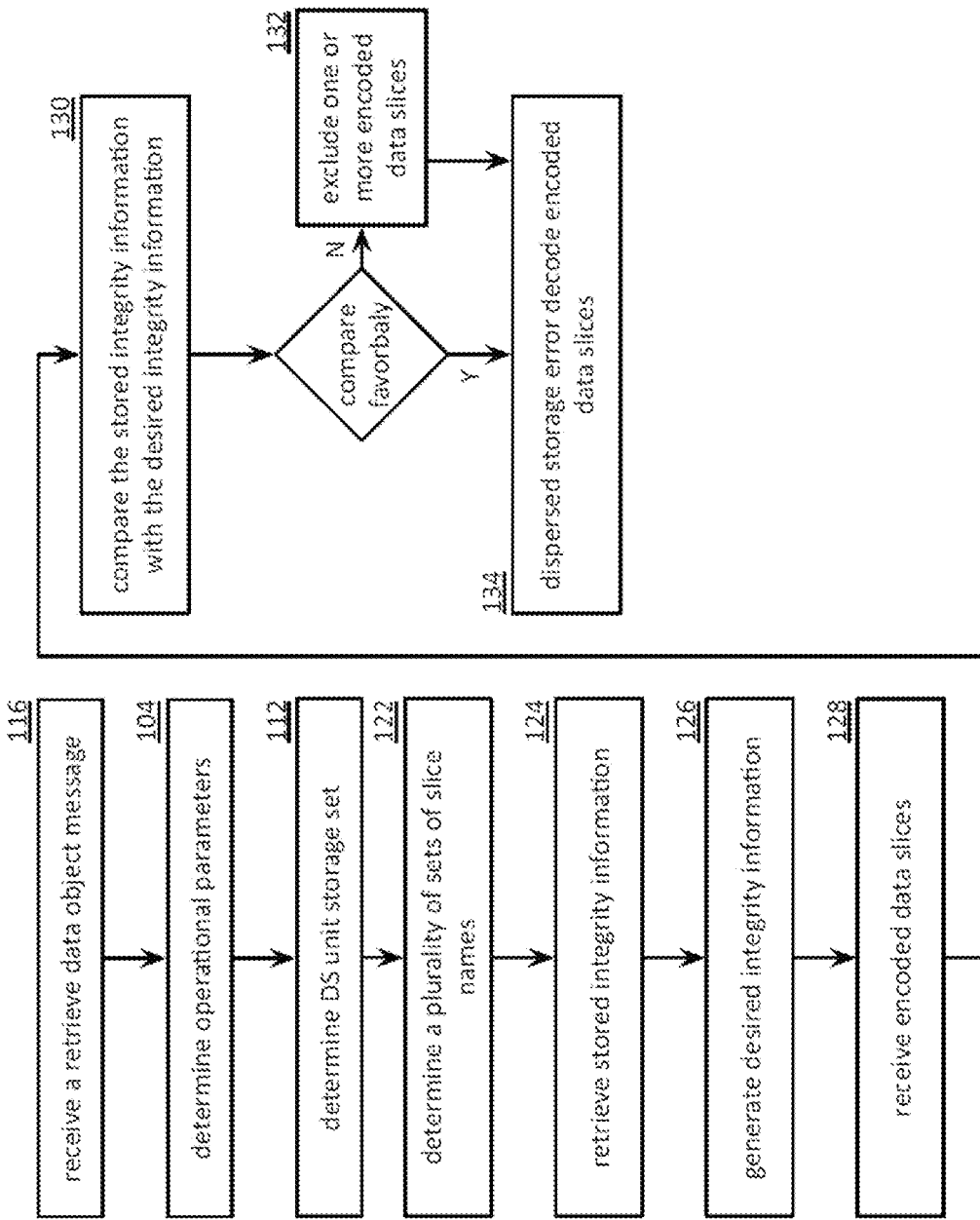
FIG. 12 is a flowchart illustrating an example of verifying slice integrity in accordance with the invention.

FIG. 12 is a flowchart illustrating an example of verifying slice integrity, which includes similar steps to FIG. 11. The method begins with step 116 where a processing module receives a data retrieval request. Such a data retrieval request includes one or more of a retrieve data object request, a user identifier (ID), a data object name, a data ID, a data type indicator, a data object hash, a vault ID, a data size indicator, a priority indicator, a security indicator, and a performance indicator. The method continues with step 104 of FIG. 11 where the processing module determines dispersed storage error coding parameters (e.g., operational parameters) and with step 112 of FIG. 11 where the processing module determines a dispersed storage (DS) unit storage set.

The method continues at step 122 where the processing module determines a plurality of sets of slice names in accordance with the data retrieval request. Such a determination may be based on one or more of the data ID, the user ID, the vault ID, the dispersed storage error coding parameters, and extraction of a data size indicator from a reproduced data segment. The method continues at step 124 where the processing module receives stored integrity information corresponding to the data retrieval request. For example, the processing module sends one or more stored integrity information request messages to the DS unit storage set and receives the stored integrity information in response, wherein the stored integrity information request messages include at least some of the plurality of sets of slice names. Note that the stored integrity information and associated encoded data slices were previously stored in the DS unit storage set.

The method continues at step 126 where the processing module generates desired integrity information based on the plurality of sets of slice names. Such a generation of the desired integrity information may be based on one or more of the five integrity methods discussed with reference to FIG. 11.

The method continues at step 128 where the processing module receives encoded data slices. For example, the processing module sends encoded data slice retrieval messages to the DS unit storage set that includes at least some of the plurality of sets of slice names and receives the encoded data slices in response. The method continues at step 130 where the processing module compares the stored integrity information with the desired integrity information. For example, the processing module decrypts the stored integrity information using a public key of a public-private key pair to produce at least some of a plurality of sets of reconstructed slice names and compares corresponding slices names of the plurality of sets of slice names with the at least some of a plurality of sets of reconstructed slice names when the stored integrity information includes encrypted slice names (e.g., a digital signature, encrypted slice names) encrypted with a private key of the super public-private key pair.

As another example of comparing at step 130, the processing module decrypts the stored integrity information using a shared key to produce the at least some of the plurality of sets of reconstructed slice names a compares corresponding slice names of the plurality of sets of slice names with the at least some of the plurality of sets of reconstructed slice names when the stored integrity information includes encrypted slice names encrypted with the shared key. The processing module compares the stored integrity information directly to the desired integrity from a when the stored integrity information includes results of a hash function (e.g., a HMAC).

As yet another example of comparing at step 130, when multiple integrity methods are used (e.g., the fourth integrity and the second or third integrity methods), a higher level comparison is performed first (e.g., use the forth integrity method). If it successful, the method continues based on a favorable comparison. If, however, the higher level comparison was not successful, a lower level comparison is performed (e.g., the second or third integrity method). For sets of encoded data slices that the lower level comparison was successful, the method continues based on a favorable comparison. For the sets of encoded data slices that the lower level comparison was not successful, an error is generated or another comparison may be performed based on the individual integrity information.

As a specific example, an integrity check is initially performed for the data file. If successful, the method continues with decoding the plurality of sets of encoded data slices to recapture the data file (e.g., step 134). If the data file level integrity check was not successful, then a set level integrity check is performed to identify which sets have an error. For each set having an error, an individual encoded slice name integrity check may be performed to identify encoded data slices having an error. The encoded data slices having an error or sets including slices having an error may be excluded from the decoding (e.g., step 132). Even if encoded data slices have an error, as long as a decode threshold number of encoded data slices per set are available, then the data file can be accurately reproduced.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c" and/or "a" "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprising:
    storing a plurality of data in a storage system;
    determining a plurality of identifiers corresponding to the plurality of data;
    generating, for the plurality of data, a first set of integrity information corresponding to a first system storage level by performing a first set of cyclic redundancy checks;
    generating, for the plurality of data, a plurality of corresponding data structures that each include:
        a corresponding one of the plurality of identifiers; and
        corresponding integrity information of the first set of integrity information;
    storing the first set of integrity information and the plurality of identifiers in the storage system via storage of the plurality of corresponding data structures;
    generating, for the plurality of data, a second set of integrity information corresponding to a second system storage level by performing a second set of cyclic redundancy checks; and
    storing the second set of integrity information in the storage system.

2. The method of claim 1, wherein the plurality of data is generated based on erasure coding.

3. The method of claim 1, wherein the plurality of identifiers are associated with at least one data slice generated via an encoding process in accordance with a width, and wherein a corresponding decoding process can accommodate a number of failures equal to the width minus an error coding parameter of the encoding process.

4. The method of claim 1, wherein the plurality of identifiers identify a virtual memory space that maps to storage units of the storage system.

5. The method of claim 1, wherein the plurality of identifiers are determined in conjunction with determining a plurality of virtual memory addresses.

6. The method of claim 5, wherein each virtual memory address of the plurality of virtual memory addresses is associated with a physical address, and wherein the integrity information is generated based on the plurality of virtual memory addresses.

7. The method of claim 1, further comprising:
    performing periodic data storage integrity verification based on accessing at least one of the second set of integrity information in the storage system;
    wherein performing the periodic data storage integrity verification is based on periodically determining whether any of the plurality of data has been corrupted.

8. The method of claim 7, further comprising:
    rebuilding at least some of the plurality of data based on determining the at least some of the plurality of data has been corrupted.

9. The method of claim 1, wherein the storage system is configured to store the data via a plurality of system storage levels that includes the first system storage level and the second system storage level.

10. The method of claim 1, wherein the first set of integrity information is generated based on a first plurality of data portions of the plurality of data having first data structuring corresponding to the first system storage level, and wherein the second set of integrity information is generated based on a second plurality of data portions of the plurality of data having second data structuring corresponding to the second system storage level.

11. The method of claim 10, wherein each of the first plurality of data portions include multiple ones of the second plurality of data portions.

12. A computer comprises:
    a memory; and
    a processing module operable to:
        store a plurality of data in a storage system;
        determine a plurality of identifiers corresponding to the plurality of data;
        generate, for the plurality of data, a first set of integrity information corresponding to a first system storage level by performing a first set of cyclic redundancy checks;
        generate, for the plurality of data, a plurality of corresponding data structures that each include:
            a corresponding one of the plurality of identifiers; and
            corresponding integrity information of the first set of integrity information;
        store the first set of integrity information and the plurality of identifiers in the storage system via storage of the plurality of corresponding data structures;
        generate, for the plurality of data, a second set of integrity information corresponding to a second system storage level by performing a second set of cyclic redundancy checks; and
        store the second set of integrity information in the storage system.

13. The computer of claim 12, wherein the plurality of identifiers are associated with at least one data slice generated via an encoding process in accordance with a width, and wherein a corresponding decoding process can accommodate a number of failures equal to the width minus an error coding parameter of the encoding process.

14. The computer of claim 12, wherein the plurality of identifiers identify a virtual memory space that maps to storage units of the storage system.

15. The computer of claim 12, wherein the plurality of identifiers are determined in conjunction with determining a plurality of virtual memory addresses.

16. The computer of claim 15, wherein each virtual memory address of the plurality of virtual memory addresses is associated with a physical address, and wherein the integrity information is generated based on the plurality of virtual memory addresses.

17. The computer of claim 12, further comprising:
performing periodic data storage integrity verification based on accessing at least one of the second set of integrity information in the storage system;
wherein performing the periodic data storage integrity verification is based on periodically determining whether any of the plurality of data has been corrupted.

18. The computer of claim 17, further comprising:
rebuilding at least some of the plurality of data based on determining the at least some of the plurality of data has been corrupted.

19. A storage system comprises:
a plurality of storage units; and
at least one processing module operable to:
  store a plurality of data;
  determine a plurality of identifiers corresponding to the plurality of data;
  generate, for the plurality of data, a first set of integrity information corresponding to a first system storage level by performing a first set of cyclic redundancy checks;
  generate, for the plurality of data, a plurality of corresponding data structures that each include:
    a corresponding one of the plurality of identifiers; and
    corresponding integrity information of the first set of integrity information;
  store the first set of integrity information and the plurality of identifiers in the storage system via storage of the plurality of corresponding data structures;
  generate, for the plurality of data, a second set of integrity information corresponding to a second system storage level by performing a second set of cyclic redundancy checks; and
  store the second set of integrity information in the storage system.

20. The storage system of claim 19, wherein the plurality of data is generated based on erasure coding.

* * * * *